United States Patent
Lv et al.

(10) Patent No.: US 7,639,496 B2
(45) Date of Patent: Dec. 29, 2009

(54) HOT PLUGGABLE FAN SYSTEM AND CONNECTION APPARATUS

(75) Inventors: Xianhong Lv, Shenzhen (CN); Yumin Du, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 12/264,407

(22) Filed: Nov. 4, 2008

(65) Prior Publication Data

US 2009/0180252 A1 Jul. 16, 2009

(30) Foreign Application Priority Data

Jan. 16, 2008 (CN) .................. 2008 1 0025843

(51) Int. Cl.
*H05K 7/20* (2006.01)
(52) U.S. Cl. .................. 361/695; 361/694; 454/184
(58) Field of Classification Search ..............................
361/679.48–679.51, 694, 695; 454/184
See application file for complete search history.

(56) References Cited

U.S. PATENT DOCUMENTS

| | | | | |
|---|---|---|---|---|
| 5,562,410 | A * | 10/1996 | Sachs et al. ............ | 415/213.1 |
| 6,229,971 | B1 * | 5/2001 | Yamamoto ............ | 399/58 |
| 6,549,406 | B1 * | 4/2003 | Olesiewicz et al. ...... | 361/695 |
| 6,604,916 | B2 * | 8/2003 | Lu et al. .............. | 417/360 |
| 7,236,361 | B2 * | 6/2007 | Cote et al. ............ | 361/695 |
| 7,535,709 | B2 * | 5/2009 | Fan et al. ............ | 361/695 |
| 7,558,061 | B2 * | 7/2009 | Franz et al. .......... | 361/695 |
| 2002/0054479 | A1 * | 5/2002 | Wu .................. | 361/695 |
| 2002/0141879 | A1 | 10/2002 | Winkel et al. | |
| 2003/0227748 | A1 * | 12/2003 | Chen et al. .......... | 361/695 |
| 2004/0130872 | A1 * | 7/2004 | Cravens et al. ........ | 361/695 |
| 2007/0230121 | A1 * | 10/2007 | Chen ................ | 361/695 |
| 2009/0009961 | A1 * | 1/2009 | Li .................. | 361/687 |
| 2009/0059521 | A1 * | 3/2009 | Yin ................. | 361/695 |

FOREIGN PATENT DOCUMENTS

CN 2643377 Y 9/2004

* cited by examiner

*Primary Examiner*—Gregory D Thompson
(74) *Attorney, Agent, or Firm*—Leydig, Voit & Mayer, Ltd.

(57) ABSTRACT

The present invention discloses a hot pluggable fan system and connection apparatus. The system includes at least one fan assembly, and a hot pluggable fan connection apparatus. The hot pluggable fan connection apparatus includes a bottom plate; a crossbar existed on the bottom plate, for dividing the bottom plate into a forepart and a rear part; two side panels located on both sides of the bottom plate and vertical to the crossbar; a beam connected to the two side panels and above the crossbar; and one or more fan baffles combined with the side panels for forming at least one slot for accommodating the fan assembly, the baffles located at the forepart of the bottom plate and parallel to the side panels.

11 Claims, 8 Drawing Sheets

HOT PLUGGABLE FAN SYSTEM AND CONNECTION APPARATUS

CROSS-REFERENCE TO RELATED APPLICATIONS

This application claims priority to Chinese Patent Application No. 200810025843.1, filed Jan. 16, 2008, entitled "Hot Pluggable Fan System and Connection Apparatus," the contents of which are hereby incorporated by reference in its entirety.

FIELD OF THE INVENTION

The present invention relates to fans and connection apparatus thereof, and more particularly, to a hot pluggable fan system and a connection apparatus.

BACKGROUND OF THE INVENTION

With the progress of technologies, electronic products are more and more efficient. However, electronic products produce heat during operation, and increase the ambient temperature of the whole system. If no proper heat dissipation mechanism is applied, the system will deteriorate in stability and efficiency and even fail. Generally, heat dissipation apparatuses such as fans, are applied to keep the electronic products working in a certain temperature.

Nowadays, in a computer system, especially in server or storage fields, a system always runs 24 hours a day without interruption. Therefore, the hot plug technology is applied widely in the server and storage fields. The hot plug technology means the system keeps running normally without interruption while a system component is plugged or unplugged directly. The technology overcomes the trouble of powering off the system and interrupting the service to maintain the system. Fans are mechanical units with the highest failure rate in a computer system. It is necessary to develop a hot pluggable fan system to improve the system maintainability.

Figure 1:
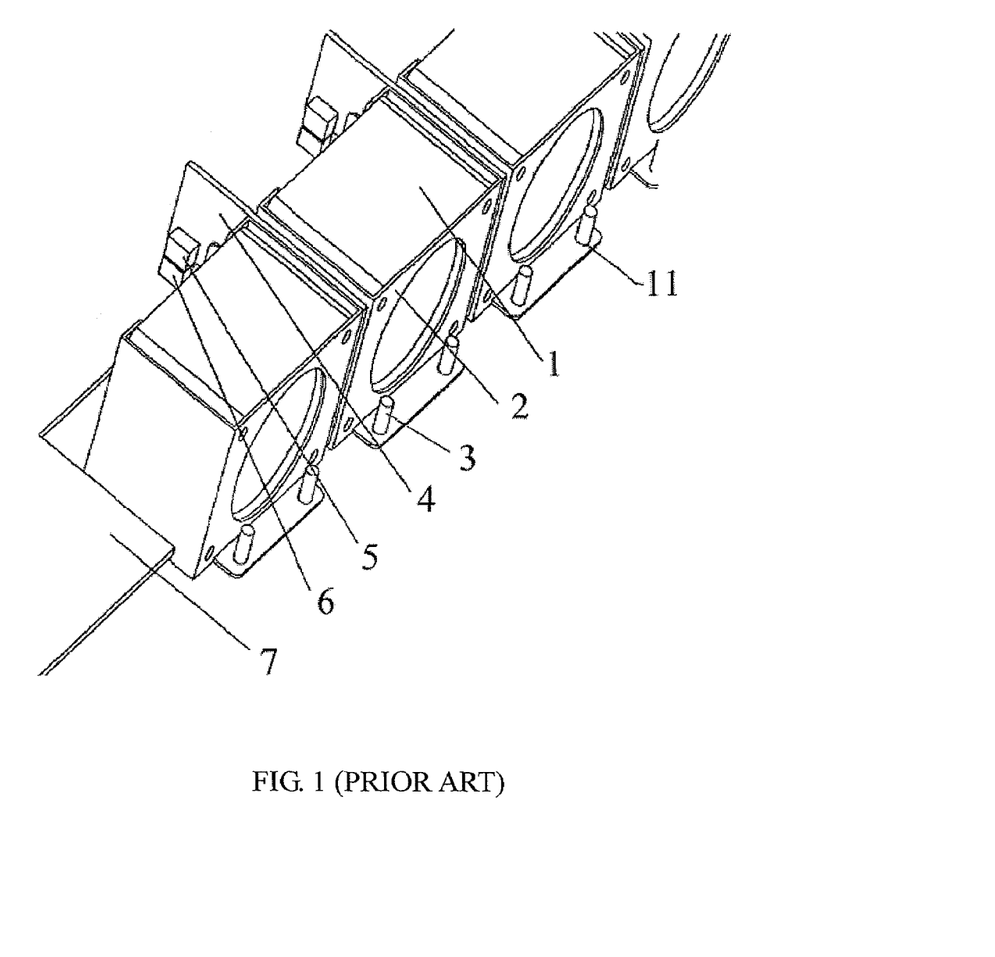
FIG. 1 is a schematic diagram of a hot pluggable fan, according to the related art.
Figure 2:
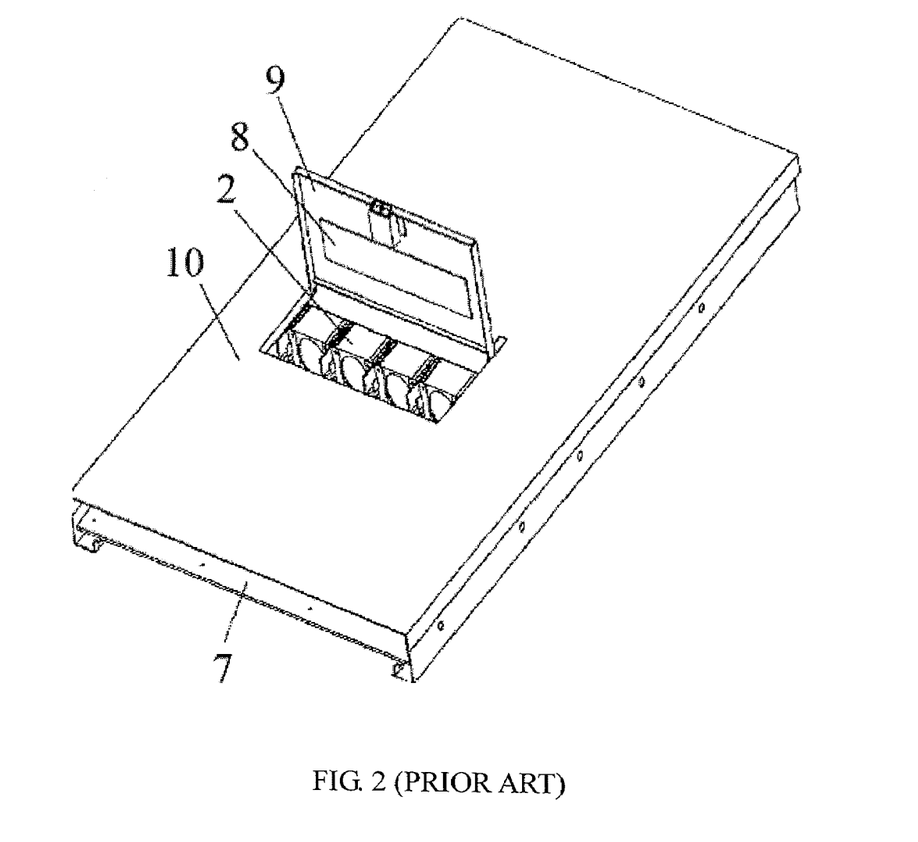
FIG. 2 illustrates the assemblage of the hot pluggable fan shown in FIG. 1 and a unit server frame.

Chinese patent numbered 02205245.3 discloses an installation apparatus for a hot pluggable fan of a unit server. FIGS. 1-2 show how the hot pluggable installation apparatus is installed on a unit server frame. As shown in FIG. 1 and FIG. 2, a flip-up cover 9 is set on an upper cover 10 of the unit server frame 8, which is according to the location of the fan assembly in the unit server frame. The fan assembly is fixed on the bottom plate of the unit server frame through a fixing apparatus, namely, a positioning rod 3 and a positioning hole 11, and is electrically connected to a control mainboard 7 through sockets 5 and 6. A fan assembly includes a heat-dissipating fan 1, a fan bracket 2, and a circuit board 4. The heat-dissipating fan 1 is fixed in the fan bracket 2. The circuit board 4 is fixed on the fan bracket 2. To assemble or disassemble the fan assembly and the unit server frame, the user can open the flip-up cover 9 to pull out the fan assembly upward or insert the fan assembly downward. After the fan assembly is installed, the flip-up cover 9 can be closed and the fan assembly is replaced.

As shown in FIG. 1, the fan assembly of the foregoing structure is fixed on the bottom plate of the frame through the upper cover of the frame, and the unit server frame is divided into a forepart and a rear part. If the unit server frame uses a backplane to connect the forepart and the rear part and single boards are respectively inserted from the forepart and the rear part of the frame into a slot on the backplane and traverses the unit server frame, the fan assembly of the foregoing structure is not installable. Therefore, the foregoing installation solution is not applicable to the structure in which the backplane connects the forepart and the rear part. Moreover, if a number of unit server frames are overlaid on a rack, the flip-up cover 9 will be obstructed. The unit server frames need to be moved down before a fan is replaced, which makes the maintenance inconvenient.

SUMMARY OF THE INVENTION

According to embodiments of the present invention, a hot pluggable fan system and a connection apparatus are provided.

A hot pluggable fan connection apparatus includes: a bottom plate; a crossbar existed on the bottom plate, for dividing the bottom plate into a forepart and a rear part; two side panels located on both sides of the bottom plate and vertical to the crossbar; a beam connected to the two side panels and above the crossbar; and one or more fan baffles combined with the side panels for forming at least one fan slot, the baffles located at the forepart of the bottom plate and parallel to the side panels.

A hot pluggable fan system includes: at least one fan assembly, and a hot pluggable fan connection apparatus, which includes: a bottom plate; a crossbar existed on the bottom plate, for dividing the bottom plate into a forepart and a rear part; two side panels located on both sides of the bottom plate and vertical to the crossbar; a beam connected to the two side panels and above the crossbar; and one or more fan baffles combined with the side panels for forming at least one slot for accommodating the fan assembly, the baffles located at the forepart of the bottom plate and parallel to the side panels.

BRIEF DESCRIPTION OF THE DRAWINGS

Embodiments of the present invention will become more fully understood from the detailed description given herein below for illustration only, and thus are not limitative to the present invention.

DETAILED DESCRIPTION OF THE EMBODIMENTS

The present invention is illustrated in detail below by reference to embodiments and the accompanying drawings.

Figure 3:
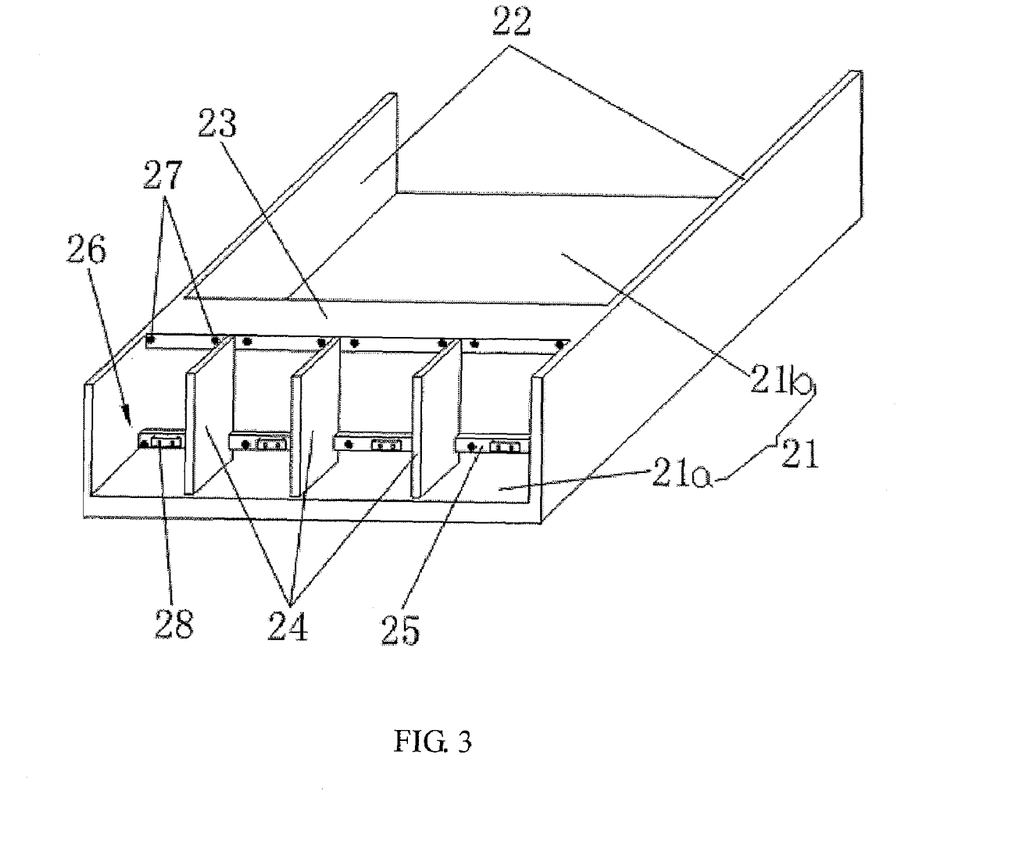
FIG. 3 is a schematic diagram of a hot pluggable fan connection apparatus, according to an embodiment of the present invention.

FIG. 3 illustrates the structure of a hot pluggable fan connection apparatus 20 in an embodiment of the present invention. As shown in FIG. 3, the hot pluggable fan connection apparatus 20 includes a bottom plate 21, side panels 22, a beam 23, and fan baffles 24. A crossbar 25 exists on the bottom plate 21 and is parallel to one side of the bottom plate 21, and divides the bottom plate 21 into a forepart 21a and a rear part 21b. The side panels 22 are located on both sides of the bottom plate 21, and vertical to the crossbar 25. The beam 23 is connected to the two side panels 22, and is above the crossbar 25. The fan baffles 24 are located at the forepart 21a of the bottom plate 21, parallel to the side panels 22, and combine with the side panels 22 to form at least one fan slot 26. The rear part 21b of the bottom plate is adapted to connect to a single board.

In this embodiment, there are three fan baffles 24, which combine with the side panels 22 to form four fan slots 26. According to each fan slot 26, a power socket 28 is set on the crossbar 25 for the purpose of supplying power to the fan. According to the crossbar 25 and the beam 23, a number of fixed screw holes 27 are set for fixing the fan.

Accordingly, the number of the fan slots 26 is not limit to four. It can be adjusted by changing the locations of the fan baffles 24 according to the system requirements. The power socket 28 may be an external power socket rather than being on the crossbar 25.

Figure 4:
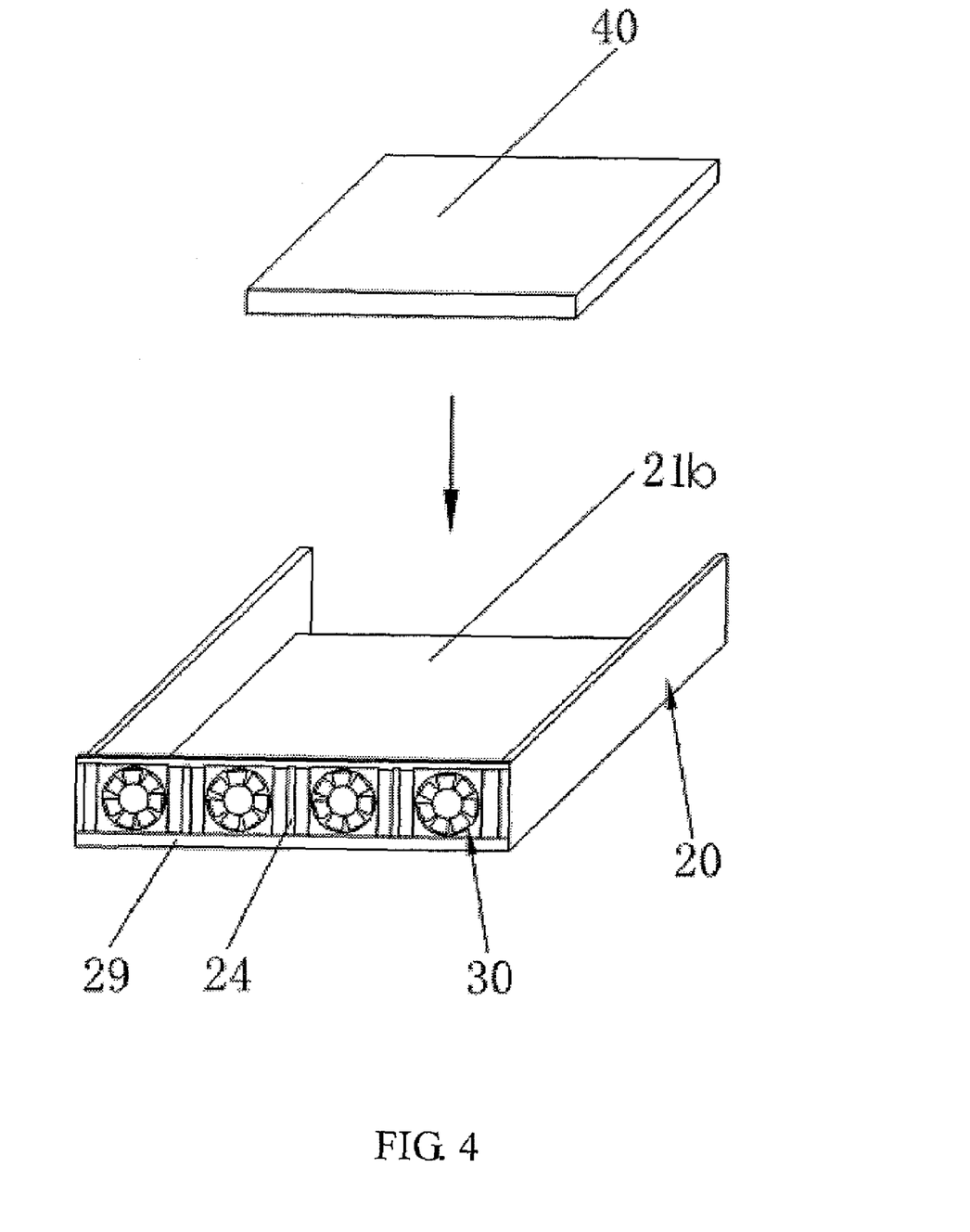
FIG. 4 illustrates the layout before a hot pluggable fan system with the connection apparatus shown in FIG. 3 is assembled with a single board.

FIG. 4 illustrates a hot pluggable fan system with the fan connection apparatus shown in FIG. 3. The hot pluggable fan system includes the fan connection apparatus 20 and a fan assembly 30.

Figure 5:
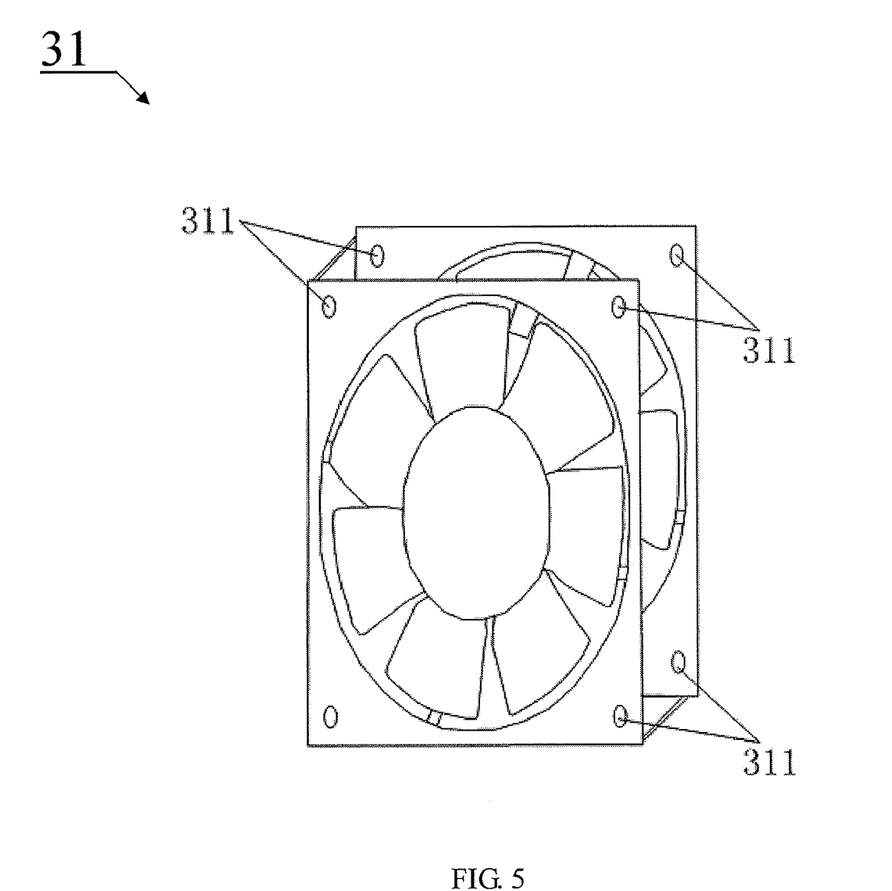
FIG. 5 is a schematic diagram of a fan, according to an embodiment of the present invention.
Figure 6:
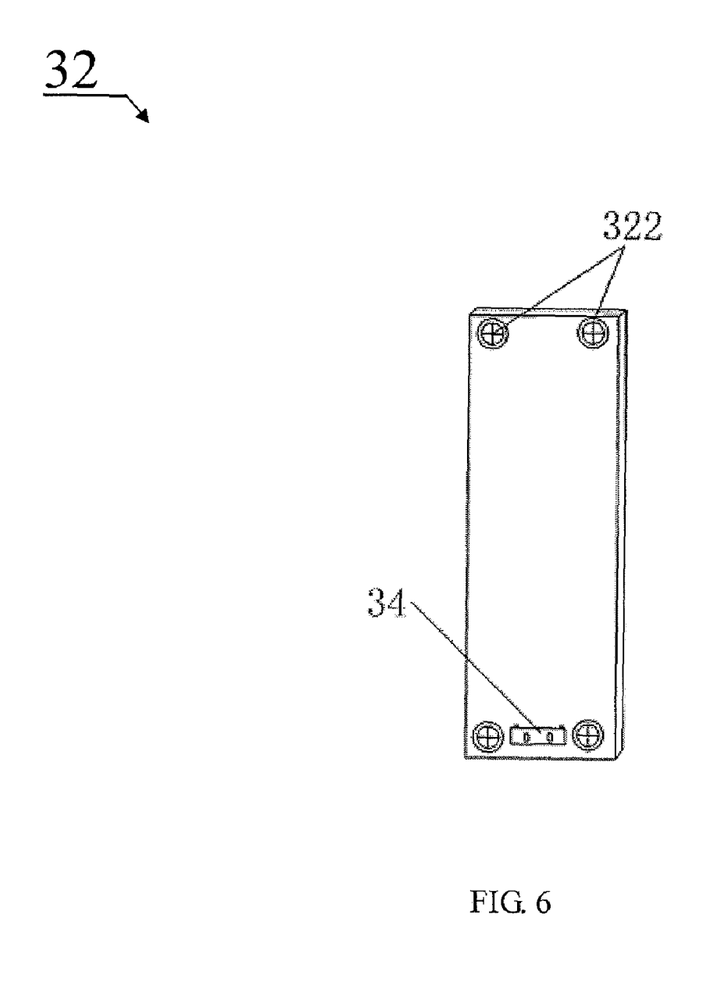
FIG. 6 is a schematic diagram of a power transfer board in the hot pluggable fan system shown in FIG. 4.
Figure 7:
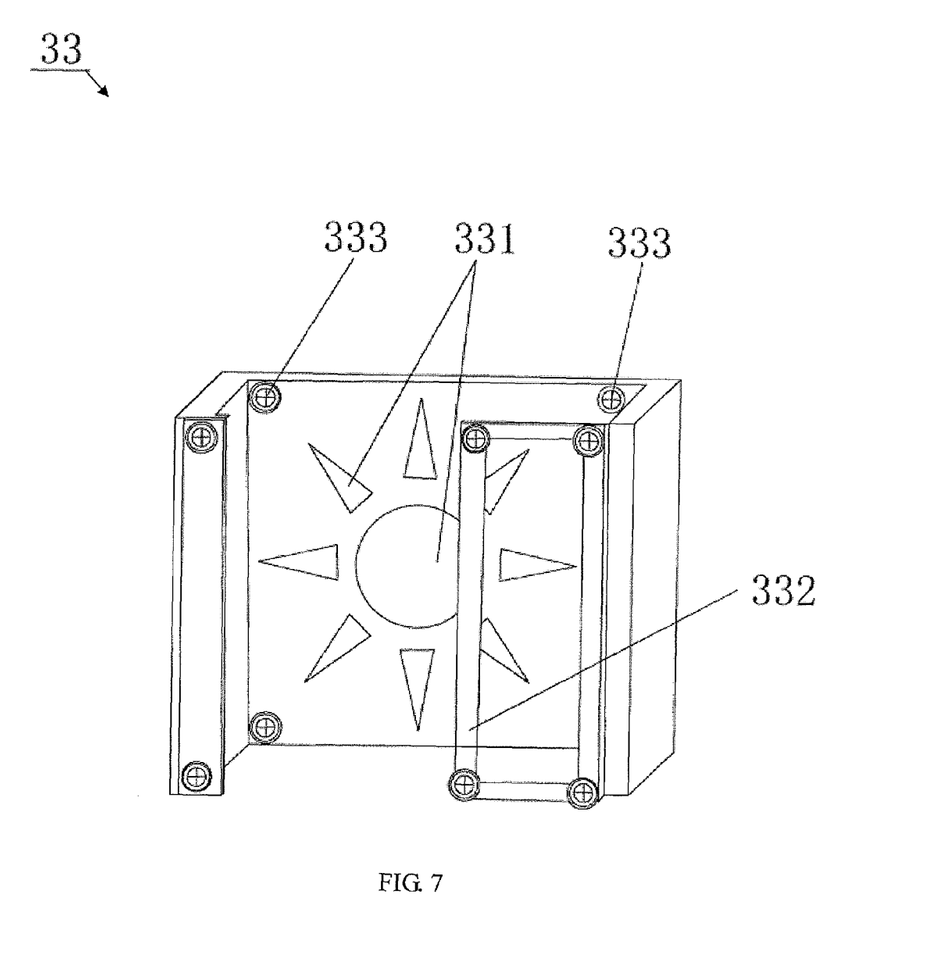
FIG. 7 is a schematic diagram of a fan box in the hot pluggable fan system shown in FIG. 4.

As shown in FIGS. 5-7, the fan assembly 30 includes a fan 31, a power transfer board 32 and a fan box 33. The fan 31 has installation holes 311, which correspond to the fixed screw holes 27 on the crossbar 25 and the beam 23. The power transfer board 32 has installation holes 322. The fan box 33 has an air vent 331, a transfer board bracket 332, and several installation holes 333. The installation holes 333 of the fan box 33 correspond to the installation holes 311 of the fan 31 and the installation holes 322 of the power transfer board 32. The power transfer board 32 is fixed on the transfer board bracket 332, and the fan 31 is fixed on the fan box 33. When the fan 31 runs, the air vent 331 expels the airflow generated by the fan 31 to dissipate heat. The power transfer board 32 has two electrically connected sockets 34. In this embodiment, the two sockets 34 are located on both sides of the power transfer board 32. One socket 34 is connected to the power and control terminal (flexible wire) attached to the fan 31, namely, electrically connected to the fan. The other socket 34 corresponds to the power socket 28 on the fan connection apparatus 20. In this way, the power and control terminal of the fan 31 is fixed onto the fan 31 through the power transfer board 32 for ease of hot plugging.

The fan 31 and the power transfer board 32 are fixed on the fan box 33 through installation holes 311, 322 and 333, and form a fan assembly 30 after electrical connection. The fan assembly 30 is located in the fan slot 26 of the fan connection apparatus 20. A number of screws (not illustrated herein) fix the fan assembly 30 onto the fan connection apparatus 20 through the screw holes 27 on the beam 23 and the crossbar 25, and through the installation holes 333 of the fax box 33.

Accordingly, the fan 31 and the power transfer board 32 are fixed on the fan box 33 not necessarily through screws and screw holes, but possibly in any other proper way.

Figure 8:
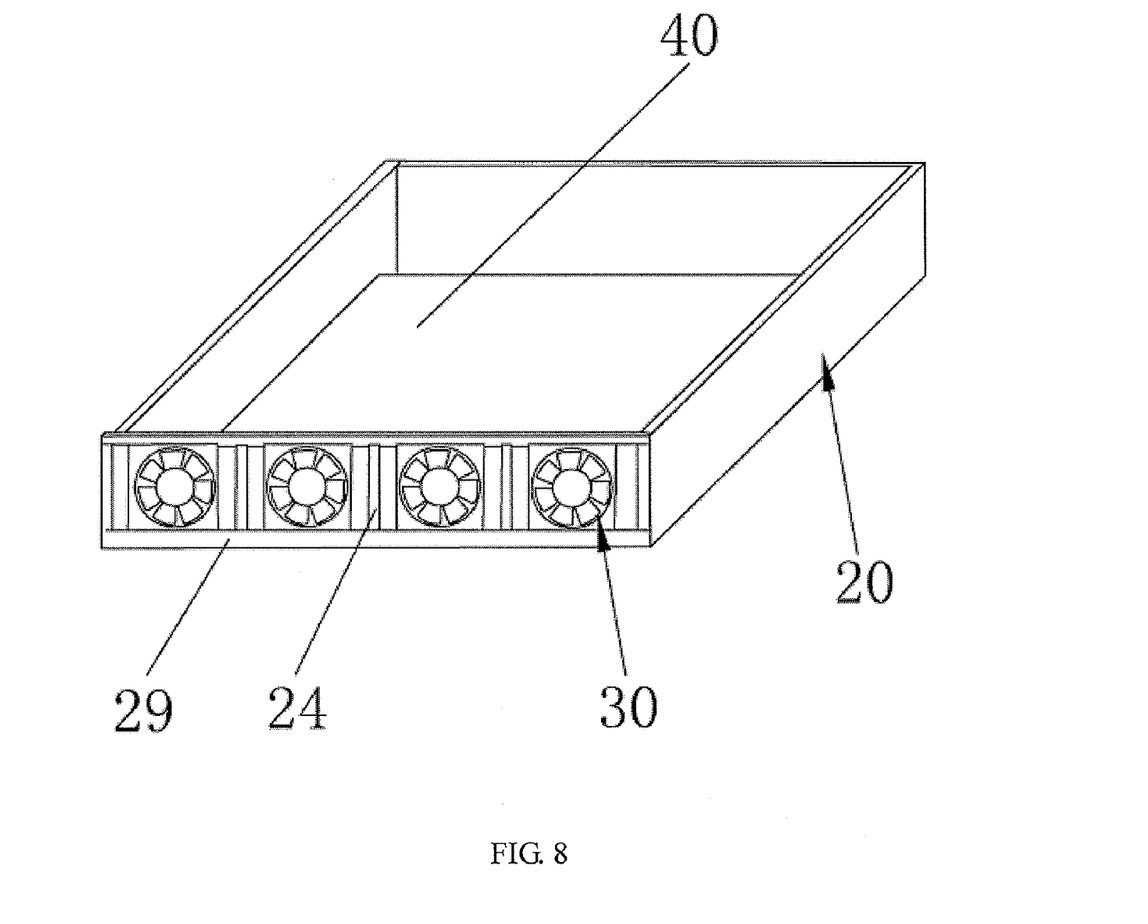
FIG. 8 illustrates the layout after the hot pluggable fan system shown in FIG. 4 is assembled with a single board.

FIG. 8 illustrates the layout after the hot pluggable fan system shown in FIG. 4 is assembled with a single board 40. As shown in FIG. 3 and FIG. 8, the single board 40 is located at the rear part 21b of the bottom plate 21 of the fan connection apparatus 20, and is connected to the fan connection apparatus 20 fixedly through screws or fasteners (not illustrated herein). The single board 40 is electrically connected to the power socket 28 on the crossbar 25. The power socket 28 is electrically connected to the power transfer board 32, so that the board 40 can supply power to the fan 31. After being connected to the single board 40, the hot pluggable fan system is inserted into a unit server frame (not illustrated herein) through a slot or slide rails from the forepart or rear part of the unit server frame, so that the single board 40 located at the rear part 21b of the bottom plate 21 is inserted into the slot of the unit server frame. In this case, the fan assembly 30 located at the forepart 21a of the bottom plate 21 is outside the unit server frame, namely, forepart or rear part of the unit server frame. As shown in FIG. 8, the hot pluggable system further includes a front panel 29. The front panel 29 is fixed onto the top of the forepart 21a of the bottom plate 21 of the fan connection apparatus 20. The front panel 29 combines with structures of the unit server frame to form a shielding enclosure (not illustrated herein) to shield the external interference and facilitate unplugging of the hot pluggable fan system and the single board 40 from the unit server frame.

The mode of fixing the single board 40 with the fan connection apparatus 20 and the mode of connecting the single board 40 to the equipment, such as the unit serve frame are well known to the technicians in this field. Because any proper connection mode is applicable, further description is not provided here.

In the hot pluggable fan system provided in an embodiment of the present invention, the fan assembly 30 may be inserted into the unit serve frame with the fan connection apparatus 20, and located outside the unit serve frame. If the board 40 on the fan connection apparatus 20 is damaged, it is only necessary to unplug the fan connection apparatus 20 to replace the single board 40, without disassembling the fan 31. If the fan 31 fails, it is only necessary to unplug the fan connection apparatus 20 from the forepart or rear part of the unit serve frame to replace the damaged fan 31, without disassembling other components on the frame. Therefore, the maintenance is rather convenient, with little impact on the system. Moreover, the fan 31 is located at the forepart or rear part of the unit serve frame, thus providing perfect ventilation and achieving the best effect of heat dissipation. Furthermore, the fan assembly 30 is fixed through screw holes 27 onto the fan connection apparatus 20 by using screws (not illustrated herein), the vibration is minimized and the noise is low.

In a hot pluggable fan system provided in another embodiment of the present invention, the fan 31 is fixed into the fan slot 26 directly through installation holes 311 and screw holes 27, and is powered by an external power supply (not illustrated herein).

The hot pluggable fan system provided in embodiments of the present invention is widely applicable to all kinds of equipment, storage devices and servers.

The foregoing are only preferred embodiments of the invention and are not for use in limiting the protection scope thereof. Any modification, equivalent replacement and improvement within the spirit and principle of this invention shall be covered in the scope defined by the appended claims.

What is claimed is:

1. A hot pluggable fan connection apparatus comprising:
a bottom plate;
a crossbar existed on the bottom plate, for dividing the bottom plate into a forepart and a rear part;
two side panels located on both sides of the bottom plate and vertical to the crossbar;
a beam connected to the two side panels and above the crossbar; and one or more fan baffles combined with the side panels for forming at least one fan slot, said one or more baffles located at the forepart of the bottom plate and parallel to the side panels.

2. The hot pluggable fan connection apparatus according to claim 1, wherein a power socket is set on the crossbar according to the fan slot for supplying power to a fan.

3. The hot pluggable fan connection apparatus according to claim 1, wherein one or more holes are set on the crossbar and the beam, according to one or more installation holes on a fan.

4. A hot pluggable fan system comprising:
   at least one fan assembly; and
   a hot pluggable fan connection apparatus, wherein the hot pluggable fan connection apparatus comprises:
   a bottom plate;
   a crossbar existed on the bottom plate, for dividing the bottom plate into a forepart and a rear part;
   two side panels located on both sides of the bottom plate and vertical to the crossbar;
   a beam connected to the two side panels and above the crossbar; and
   one or more fan baffles combined with the side panels for forming at least one slot for accommodating said fan assembly, said one or more baffles located at the forepart of the bottom plate and parallel to the side panels.

5. The hot pluggable fan system according to claim 4, wherein said fan assembly comprises a fan.

6. The hot pluggable fan system according to claim 5, wherein one or more holes are set on the crossbar and the beam according to one or more installation holes on the fan, the fan is fixed on the hot pluggable fan connection apparatus through said one or more holes.

7. The hot pluggable fan system according to claim 5, wherein said fan assembly further comprises a fan box for accommodating the fan.

8. The hot pluggable fan system according to claim 7, wherein one or more holes are set on the crossbar and the beam according to one or more installation holes on the fan box, the fan box is fixed on the hot pluggable fan connection apparatus through said one or more holes.

9. The hot pluggable fan system according to claim 7, wherein the crossbar comprises a power socket for supplying power to the fan, said fan assembly further comprises a power transfer board with two sockets for respectively electrically connecting to the fan and the power socket.

10. The hot pluggable fan system according to claim 4, wherein said fan assembly electrically connects to an external power supply.

11. The hot pluggable fan system according to claim 4, wherein the hot pluggable fan system further comprises a front panel, which is fixed onto the top of the forepart of the bottom plate of the fan connection apparatus.

* * * * *